US012684874B2

(12) United States Patent
Yang et al.

(10) Patent No.:    US 12,684,874 B2
(45) Date of Patent:        Jul. 14, 2026

(54) LOGIC CIRCUITS INCLUDING CIRCUITS OF DIFFERENT HEIGHTS AND RELATED METHOD OF FABRICATION

(71) Applicant: QUALCOMM Incorporated, San Diego, CA (US)

(72) Inventors: Haining Yang, San Diego, CA (US); Hyunwoo Park, San Diego, CA (US); Ming-Huei Lin, New Taipei City (TW); Junjing Bao, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 502 days.

(21) Appl. No.: 18/189,482

(22) Filed: Mar. 24, 2023

(65) Prior Publication Data

US 2024/0321861 A1    Sep. 26, 2024

(51) Int. Cl.
H10D 30/67        (2025.01)
H10D 30/01        (2025.01)
(Continued)

(52) U.S. Cl.
CPC ........... H10D 89/10 (2025.01); H10D 30/014 (2025.01); H10D 30/43 (2025.01); (Continued)

(58) Field of Classification Search
CPC ........ H10D 30/501–509; H10D 30/019–0198; H10D 62/121; H10D 30/43–435; H10D 30/47; H10D 30/481–485; H10D 30/6757; H10D 84/014; H10D 89/10;

H10D 30/014; H10D 30/6735; H10D 64/017; H10D 84/907; H10D 84/85; H10D 84/0167; H10D 84/038; H10D 84/0128; H10D 84/0158;
(Continued)

(56) References Cited

U.S. PATENT DOCUMENTS

2010/0187617 A1    7/2010   Becker
2020/0168607 A1*   5/2020   Yang ..................... H10D 62/151
(Continued)

OTHER PUBLICATIONS

International Search Report and Written Opinion for International Patent Application No. PCT/US2024/09409, mailed Jul. 4, 2024, 20 pages.

*Primary Examiner* — Moin M Rahman
(74) *Attorney, Agent, or Firm* — Withrow & Terranova, PLLC

(57)        ABSTRACT

A logic circuit includes a first circuit having a first diffusion region and a second diffusion region and a second circuit having a third diffusion region, and a fourth diffusion region. First devices in the first circuit each include a portion of the first diffusion region and a portion of the second diffusion region. Second devices in the second circuit each include portions of the third and fourth diffusion regions. The first diffusion region is between the second diffusion region and the third diffusion region. The third diffusion region is between the first diffusion region and the fourth diffusion region. A second distance from a first side of the fourth diffusion region to a second side of the third diffusion region is less than a first distance from a first side of the first diffusion region to a second side of the second diffusion region.

20 Claims, 8 Drawing Sheets

(51) Int. Cl.

| | |
|---|---|
| *H10D 30/43* | (2025.01) |
| *H10D 62/10* | (2025.01) |
| *H10D 64/01* | (2025.01) |
| *H10D 84/90* | (2025.01) |
| *H10D 89/10* | (2025.01) |

(52) U.S. Cl.

CPC ..... *H10D 30/6735* (2025.01); *H10D 30/6757* (2025.01); *H10D 62/121* (2025.01); *H10D 64/017* (2025.01); *H10D 84/907* (2025.01)

(58) Field of Classification Search

CPC ............. H10D 84/0177; H10D 84/834; H10D 84/853; H10D 86/215; H10D 30/6215; H10D 30/0217; H10D 30/024; H10D 84/0193; H10D 30/6728; H10D 30/6733; H10D 62/118; H10D 89/931; H10D 64/252; H10D 84/0188; H10D 84/201; H10D 18/60; H10D 30/60–798; H10D 30/021–0415; H10D 84/83–859; H10D 62/364; H10D 62/85–854; H10D 30/751; H10D 30/027–0278; H10D 30/63; H10D 84/016; H10D 84/0195; H01L 21/02068; H01L 21/32134; H01L 21/32136; H01L 21/32137; H01L 21/3213; H01L 21/0228; H01L 21/76224; H02K 15/027; A23B 2/783; A45C 11/003; A61K 40/4218; H10F 77/955; H10H 20/826; B82Y 10/00; H10B 63/34

See application file for complete search history.

(56) References Cited

U.S. PATENT DOCUMENTS

| | | | |
|---|---|---|---|
| 2020/0357786 | A1 | 11/2020 | Sio et al. |
| 2021/0226070 | A1 | 7/2021 | Liaw |
| 2021/0351175 | A1 | 11/2021 | Wang et al. |
| 2022/0336455 | A1 | 10/2022 | Lin et al. |
| 2022/0344463 | A1 | 10/2022 | Jung et al. |

* cited by examiner

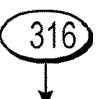

316

312
318

FORM A PLURALITY OF SECOND GATES 224(1)-224(5), EACH HAVING LONGITUDINAL AXIS Y1-Y5 DISPOSED IN A SECOND DIRECTION SUBSTANTIALLY ORTHOGONAL TO THE FIRST DIRECTION

320

FORM A PLURALITY OF SECOND DEVICES 212A-212C, EACH COMPRISING A FIRST PORTION $226A_P$ OF THE THIRD DIFFUSION REGION 214P, A SECOND PORTION $226A_N$ OF THE SECOND DIFFUSION REGION 214N AND ONE OF THE PLURALITY OF FIRST GATES 224(1)-224(5) DISPOSED ABOVE THE FIRST PORTION $226A_P$ AND ABOVE THE SECOND PORTION $262A_N$

322

WHEREIN:
EACH OF THE THIRD DIFFUSION REGION 214P, THE FOURTH DIFFUSION REGION 214N, THE FIRST DIFFUSION REGION 210P, AND THE SECOND DIFFUSION REGION 210N COMPRISES A FIRST SIDE S1 AND A SECOND SIDE S2 ORTHOGONAL TO THE SECOND DIRECTION; THE FOURTH DIFFUSION REGION 214N IS DISPOSED ON THE FIRST SIDE S1 OF THE THIRD DIFFUSION REGION 214P; THE FIRST DIFFUSION REGION 210P IS DISPOSED ON THE FIRST SIDE S1 OF THE SECOND DIFFUSION REGION 210N; AND A SECOND DISTANCE D2 FROM THE FIRST SIDE S1 OF THE FOURTH DIFFUSION REGION 214N TO THE SECOND SIDE S2 OF THE THIRD DIFFUSION REGION 214P IS LESS THAN A FIRST DISTANCE D1 FROM THE FIRST SIDE S1 OF THE FIRST DIFFUSION REGION 210P TO THE SECOND SIDE S2 OF THE SECOND DIFFUSION REGION 210N

FIG. 3B

LOGIC CIRCUITS INCLUDING CIRCUITS OF DIFFERENT HEIGHTS AND RELATED METHOD OF FABRICATION

BACKGROUND

I. Field of the Disclosure

The technology of the disclosure relates generally to logic circuits in an integrated circuit and, more particularly, to standard devices employed in a logic circuit.

II. Background

Integrated circuits (ICs) may include various functions requiring a combination of memory circuits, analog circuits, and digital logic circuits on the same semiconductor die. The logic circuits may occupy more area of the semiconductor die than the analog circuits and memory circuits. Due to the constant pressure to reduce the sizes of semiconductor dies, minimizing the area occupied by the logic circuits is an ongoing area of development. Implementing logic circuits in standardized devices, also known as "standard cells," having fixed dimensions is a common practice for minimizing logic circuit area. The uniformity of the dimensions makes it possible to densely arrange logic circuits (e.g., as arrays of standard cells). Due to the large number of standard cells used in ICs, reducing the area of the standard cells can significantly reduce the total area of a semiconductor die.

Devices in standard cells include transistors that can be configured to form different types of logic circuits. The drive currents or power requirements of transistors in devices depending on the type of function the device is configured to perform. For example, driver circuits require more power than flip-flops. Design parameters such as transistor channel size affect drive currents and power requirements. Therefore, devices may be configured with transistors of different sizes according to drive current or power requirements, but to maintain uniformity in the dimensions of the standard cells, the dimensions of a standard cell must be large enough to accommodate the largest transistor size. This means that even the devices with lower power requirements configured with smaller-sized transistors will have the same dimensions, resulting in a waste of area within the logic circuits.

SUMMARY

Aspects disclosed in the detailed description include logic circuits, including circuits of different heights. Related methods of fabricating a logic circuit with circuits of different heights are also disclosed. Logic circuits on semiconductor dies include circuits with devices implemented in rows, with each device formed according to a cell layout (e.g., a standard cell layout). Each circuit includes a first diffusion region and a second diffusion region that extend in the row direction, and each device in the circuit includes one portion of each of the diffusion regions. The portions of the diffusion regions in a device have a width in a height direction (orthogonal to a row direction) based on drive strength requirements of the device because the width is proportional to drive strength. However, in a first circuit, a first dimension in the height direction of the cell layouts of the respective devices remains constant along the row and independent of the widths of the portions of the diffusion regions in each device. Since a majority of devices in a logic circuit have a lowest power requirement, a majority of the portions of the diffusion regions only need a narrowest width, such that area is wasted in the width direction in the majority of devices. In this regard, in an exemplary aspect, a logic circuit includes, adjacent to the first circuit, a second circuit in which all portions of the first and second diffusion regions have the narrowest width configured for devices with the lowest power requirements. Thus, the second circuit also comprises a constant second dimension in the height direction, but the second dimension is smaller than the first dimension of the first circuit. In one example, the first dimension of the first circuit and the second dimension of the second circuit are an outside distance in the height direction from a first side of the first diffusion region to a second side of the second diffusion region. Logic circuits, including one of the second circuits adjacent to each first circuit, meet drive requirements for each device but occupy less area of a semiconductor die than logic circuits, including only the first circuits.

In this regard, in one aspect, a logic circuit is disclosed. The logic circuit includes a first circuit, comprising a first diffusion region disposed above a substrate and having a longitudinal axis disposed in a first direction, a second diffusion region disposed above the substrate and having a longitudinal axis disposed in the first direction, a plurality of first gates, each having a first longitudinal axis disposed in a second direction substantially orthogonal to the first direction, and a plurality of first devices. Each first device comprises a first portion of the first diffusion region, a second portion of the second diffusion region, and one of the plurality of first gates disposed above the first portion and above the second portion. In addition, the logic circuit includes a second circuit, disposed adjacent to, in the second direction, the first circuit, the second circuit comprising a third diffusion region disposed above the substrate and having a longitudinal axis disposed in the first direction, a fourth diffusion region disposed above the substrate and having a longitudinal axis disposed in the first direction, a plurality of second gates, each having a second longitudinal axis disposed in the second direction, and a plurality of second devices, each comprising a third portion of the third diffusion region, a fourth portion of the fourth diffusion region, and one of the plurality of second gates disposed above the third portion and above the fourth portion, wherein each of the third diffusion region, the fourth diffusion region, the first diffusion region, and the second diffusion region comprises a first side and a second side orthogonal to the second direction, the fourth diffusion region is disposed on the first side of the third diffusion region, the first diffusion region is disposed on the first side of the second diffusion region, and a second distance from the first side of the fourth diffusion region to the second side of the third diffusion region is less than a first distance from the first side of the first diffusion region to the second side of the second diffusion region.

In another aspect, a semiconductor die is disclosed. The semiconductor die includes a first power rail and a second power rail, each having a longitudinal axis disposed in a first direction and configured to provide a first one of a power supply voltage and a reference voltage. The semiconductor die also includes a third power rail having a longitudinal axis disposed in the first direction and configured to provide a second one of the power supply voltage and the reference voltage. The semiconductor die further includes a logic circuit, comprising a first circuit, comprising: a first diffusion region disposed above a substrate and having a longitudinal axis disposed in the first direction, and a second diffusion region disposed above the substrate and having a longitudinal axis disposed in the first direction. The first circuit also comprises a plurality of first gates, each having a longitudinal axis disposed in a second direction substantially orthogonal to the first direction and a plurality of first devices. Each of the plurality of first devices comprises a first portion of the first diffusion region, a second portion of the second diffusion region, and one of the plurality of first gates disposed above the first portion and above the second portion. The logic circuit further comprises a second circuit, disposed adjacent to, in the second direction, the first circuit, the second circuit comprising: a third diffusion region disposed above the substrate and having a longitudinal axis disposed in the first direction, and a fourth diffusion region disposed above the substrate and having a longitudinal axis disposed in the first direction. The second circuit further comprises a plurality of second gates, each having a longitudinal axis disposed in the second direction and a plurality of second devices. Each of the plurality of second devices comprises a third portion of the third diffusion region, a fourth portion of the fourth diffusion region, and one of the plurality of second gates disposed above the third portion and above the fourth portion. The first circuit is coupled to each of the first and third power rails, and the second circuit is coupled to each of the second and third power rails. Each of the third diffusion region, the fourth diffusion region, the first diffusion region, and the second diffusion region comprises a first side and a second side orthogonal to the second direction. The fourth diffusion region is disposed on the first side of the third diffusion region, and the first diffusion region is disposed on the first side of the second diffusion region. A second distance from the first side of the fourth diffusion region to the second side of the third diffusion region is less than a first distance from the first side of the first diffusion region to the second side of the second diffusion region.

In another aspect, an exemplary method of manufacturing a logic circuit is disclosed. The method includes forming a first circuit, which includes forming a first diffusion region disposed above a substrate and having a longitudinal axis disposed in a first direction, forming a second diffusion region disposed above the substrate, and having a longitudinal axis disposed in the first direction. The method of forming the first circuit further includes forming a plurality of first gates, each having a longitudinal axis disposed in a second direction substantially orthogonal to the first direction, and forming a plurality of first devices, each comprising a first portion of the first diffusion region, a second portion of the second diffusion region, and one of the plurality of first gates disposed above the first portion and above the second portion. The method further comprises forming a second circuit disposed adjacent to, in the second direction, the first circuit, which includes forming a third diffusion region disposed above the substrate and having a longitudinal axis disposed in the first direction, forming a fourth diffusion region disposed above the substrate and having a longitudinal axis disposed in the first direction. The method of forming the second circuit further includes forming a plurality of second gates, each having a longitudinal axis disposed in the second direction, and forming a plurality of second devices, each comprising a third portion of the third diffusion region, a fourth portion of the fourth diffusion region, and one of the plurality of second gates disposed above the third portion and above the fourth portion. In the logic circuit formed according to the method, each of the third diffusion region, the fourth diffusion region, the first diffusion region, and the second diffusion region comprises a first side and a second side orthogonal to the second direction, the fourth diffusion region is disposed on the first side of the third diffusion region and the second diffusion region is disposed on the second side of the first diffusion region. A second distance from the first side of the fourth diffusion region to the second side of the third diffusion region is less than a first distance from the first side of the first diffusion region to the second side of the second diffusion region.

BRIEF DESCRIPTION OF THE DRAWINGS

FIGS. 3A and 3B are flowcharts illustrating an exemplary process for making the logic circuit of FIG. 2;

DETAILED DESCRIPTION

Figures 1A, 1B:
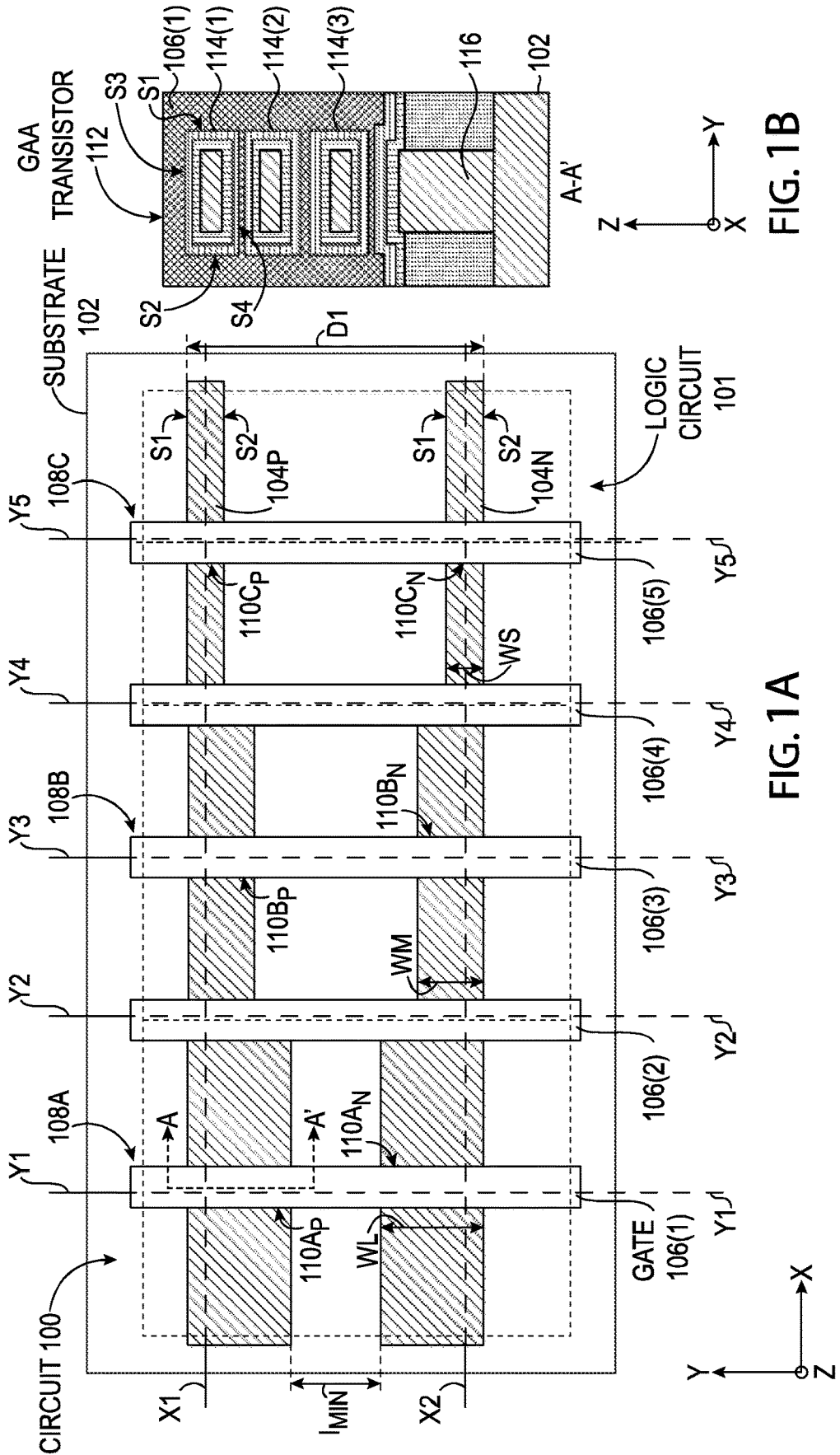
FIG. 1A is a top plan view of a circuit including diffusion regions on a substrate, where portions of the diffusion regions in each device are configured for one of a plurality of power levels but have a same diffusion region outside distance.
FIG. 1B is a cross-sectional view of the substrate in FIG. 1A at the cross-section A-A' showing the diffusion regions comprising nanosheets of a gate-all-around (GAA) transistor.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Figure 2:
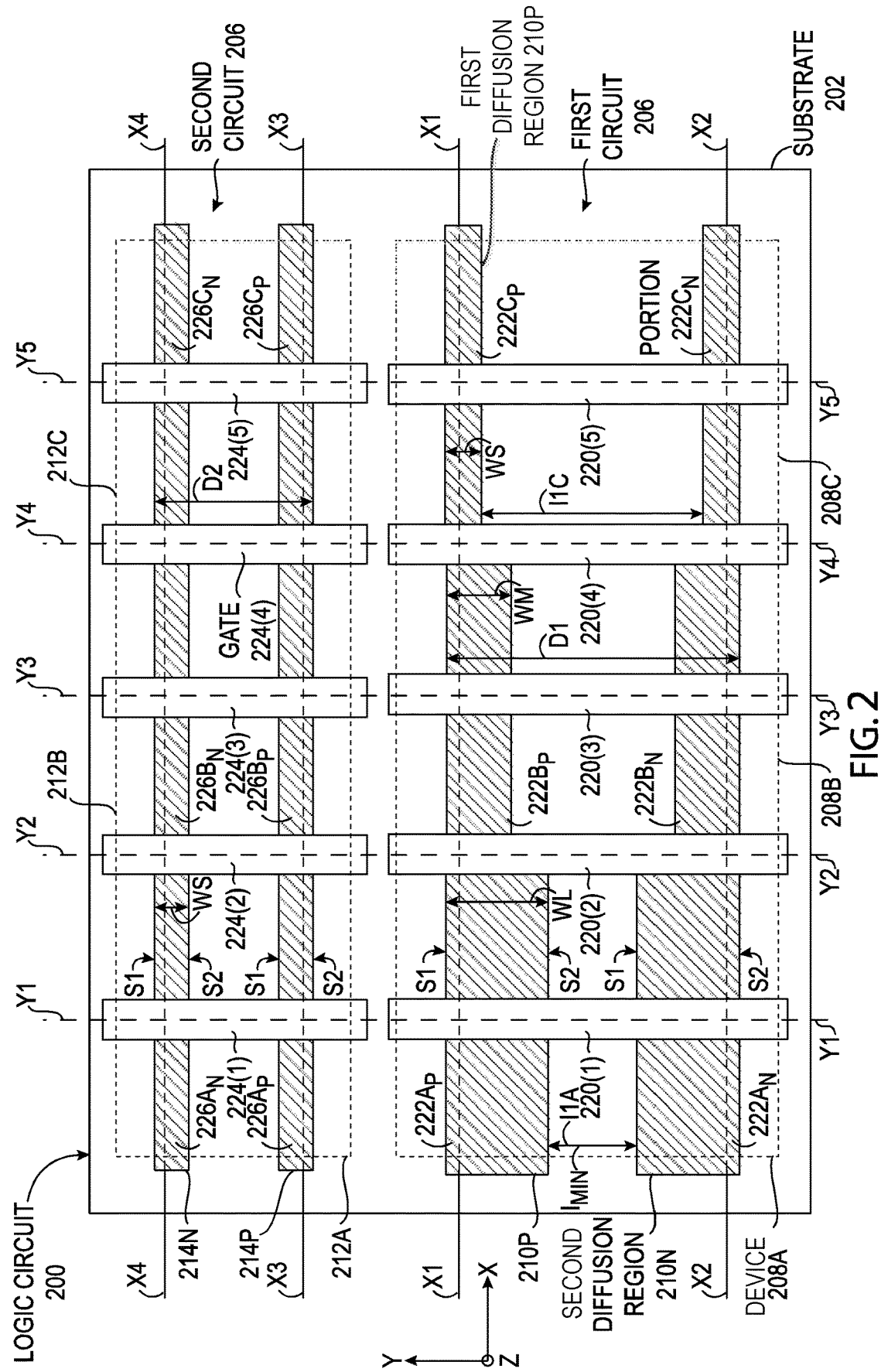
FIG. 2 is a top plan view of a first example of an exemplary logic circuit, including a first circuit as shown in FIG. 1A and a second circuit having devices configured for a lowest power level corresponding to a smaller diffusion region outside distance for area reduction.

Before describing an exemplary logic circuit as illustrated in FIG. 2, FIGS. 1A and 1B are provided to illustrate examples of conventional gate-all-around (GAA) transistors in a circuit in a logic circuit on a substrate, such as a semiconductor die. The devices are arranged in rows of uniformly sized standard cells.

FIG. 1A is a top plan view of a conventional circuit 100 of a logic circuit 101 on a substrate 102 and includes diffusion regions 104P and 104N. The diffusion regions 104P and 104N have longitudinal axes X1 and X2, respectively, extending in a first direction or row direction (X-axis direction). The circuit 100 also includes gates 106(1)-106(5) for controlling devices 108A, 108B, and 108C employed in the logic circuit 101. The gates 106(1)-106(5) have longitudinal axes Y1-Y5, respectively, extending in a height direction or second direction (Y-axis direction) orthogonal or substantially orthogonal to the first direction (X-axis direction).

The diffusion regions 104P and 104N are doped regions of a semiconductor material of the substrate 102 for forming devices 108A-108C. The first diffusion region 104P may be formed of a semiconductor material that is doped with a first type of dopant material (e.g., pentavalent), and the second diffusion region 104N may be formed of the semiconductor material doped with a second type of dopant material (e.g., trivalent). In this regard, the first diffusion region 104P may be referred to as a first-type diffusion region, and the second diffusion region 104N may be referred to as a second-type diffusion region. The first diffusion region and the second diffusion region may be N-type and P-type, respectively, depending on the dopant material type.

As discussed further below, the first and second diffusion regions 104P and 104N include portions $110A_P$ and $110A_N$ within the gate 106(1) in the device 108A, portions $110B_P$ and $110B_N$ within the gate 106(3) in the device 108B and portions $110C_P$ and $110C_N$ within the gate 106(5) in the device 108C. The gates 106(1), 106(3), and 106(5) control current flow through the devices 108A-108C. The gates 106(2) and 106(4) in this example may be dummy gates separating the devices 108A/108B and 108B/108C, respectively.

FIG. 1B is a cross-sectional side view of the circuit 100 in FIG. 1A at the cross-section A-A' of first diffusion region 104P within the gate 106(1). FIG. 1B shows that the circuit 100 is a gate-all-around (GAA) transistor 112, and the first diffusion region 104P in the device 108A includes nanosheets 114(1), 114(2), and 114(3) stacked vertically (e.g., in the Z-axis direction) above a nanosheet diffusion region 116. The nanosheet diffusion region 116 is formed from the substrate 102 (e.g., a semiconductor die), as are the nanosheets 114(1)-114(3). The gate 106(1) is disposed on both sides of (e.g., adjacent to) sides S1 and S2 of each of the nanosheets 114(1)-114(3) and also adjacent to the top surface S3 and the bottom surface S4 (e.g., all-around the nanosheets), such that a voltage applied to the gate 106(1) can control current flow in the direction of the longitudinal axis X1 in FIG. 1A (i.e., in the X-axis direction). The nanosheet diffusion region 116 extends beneath the gate 106(1).

Before formation of the gates 106(1)-106(5), the nanosheets 114(1)-114(3) extended through all the same areas as the nanosheet diffusion region 116. In a later stage of fabrication, the nanosheets 114(1)-114(3) between gates 106(1)-106(5) are removed so that source/drain regions (e.g., epitaxial source/drain material) can be formed. However, the nanosheet diffusion region 116 retains the shape (e.g., width) of the nanosheets 114(1)-114(3) in each of the devices 108A-108C. It should be recognized that the devices 108A-108C are merely examples of devices that may be formed in a circuit comprising many devices. FIG. 1B is based on a cross-sectional view of the diffusion region 104P and also represents a cross-sectional view of the second diffusion region 104N at gate 106(1). Cross-sectional views of the first and second diffusion regions 104P and 104N at gates 106(3) and 106(5) would be substantially the same as FIG. 1B, but the first and second diffusion regions 104P and 104N in those cross-sections would have the widths WM and WS, respectively, as in FIG. 1A.

With continued reference to both FIGS. 1A and 1B, a current carrying capacity of the nanosheets 114(1)-114(3) within the gate 106(1) in device 108A is proportional to (e.g., depends on) the width WL in the Y-axis direction. As shown in FIG. 1A, the first and second diffusion regions 104P and 104N have one of three widths, including the width WL (large), a width WM (medium), and a width WS (small) in the devices 108A, 108B, and 108C, respectively. These three widths are merely exemplary because the first and second diffusion regions 104P and 104N in a circuit like the circuit 100 may include more or fewer width options. The widths WL, WM, and WS are measured in the height direction, from a first side S1 to a second side S2 of the first diffusion region 104P and from a first side S1 to a second side S2 of the second diffusion region 104N. Thus, the portions $110A_P$ and $110A_N$ in the gate 106(1) have the width WL, the portions $110B_P$ and $110B_N$ in gate 106(3) have the width WM, and the portions $110C_P$ and $110C_N$ in the gate 106(5) have the width WS. Accordingly, the device 108A has the highest current carrying capacity, the device 108C has the smallest current carrying capacity, and the device 108B has an intermediate current carrying capacity.

In this example, both of the portions $110A_P$ and $110A_N$ are the same width WL in the device 108A. However, to provide a balanced current-carrying capability, the first diffusion region 104P and the second diffusion region 104N in one of the devices 108A-108C may have different widths. These different width options correspond to power level options for which the devices 108A-108C can be configured depending on the logic circuit function in which they are employed. For example, drivers need a high current carrying capability, whereas a flip-flop or other low-load devices may only need a low current carrying capability. The gate 106(2) between the device 108A and the device 108B may be a dummy gate or non-functional gate, for example, at the transition of the diffusion regions 104P and 104N between the widths WL and WM. There may be a cut in the diffusion regions 104P and 104N filled by the dummy gate 106(2). The gate 106(4) between devices 108B and 108C may also be a dummy gate.

The layout of the devices 108A-108C of the circuit 100 is large enough that any or all of the devices 108A-108C could have been configured for the highest power level, corresponding to the width WL. Due to this potential for configurability, the standard cells in which the devices 108A-108C are employed have the same dimension in the Y-axis direction. For example, an outside distance D1 from the first side S1 of the first diffusion region 104P to the second side S2 of the second diffusion region 104N (referred to herein as an outside distance of the first and second diffusion regions 104P and 104N) is the same in each of the devices 108A-108C, even though the first and second diffusion regions 104P and 104N have different widths WL, WM, and WS. In the device 108A, for example, the outside distance D1 includes the widths WL of the first and second diffusion regions 104P and 104N and also includes a minimum inner distance $I_{MIN}$ between the portions $110A_P$ and $110A_N$. For example, the minimum inner distance $I_{MIN}$ may be a minimum fabrication requirement. However, because the first and second diffusion regions 104P and 104N have the width WM in the device 108B, which is less than the maximum width WL, but still have the outside distance D1, the portions $110B_P$ and $110B_N$ are separated by more than the minimum inner distance $I_{MIN}$, resulting in wasted space in the device 108B. In this regard, even more space is wasted between the portions $110C_P$ and $110C_N$ in the device 108C. Frequently, the majority of standard cells in a logic circuit are configured to the smallest current carrying capacity, such that the first and second diffusion regions 104P and 104N have the smallest width WS as in the device 108C. Therefore, a majority of the devices in a logic circuit may include a significant amount of wasted space.

FIG. 2 is a top plan view of a first example of an exemplary logic circuit 200 on a substrate 202 (e.g., semiconductor substrate), including a first circuit 204 having a first outside distance D1 and a second circuit 206 having a second outside distance D2. The outside distance D1 corresponds to the outside distance D1 in FIG. 1A and is based on devices 208A-208C in which a first diffusion region 210P and a second diffusion region 210N can be configured to any of widths WL, WM, and WS. In addition, the widths WL, WM, and WS of the first and second diffusion regions 210P and 210N may or may not be the same as each other. That is, depending on circuit requirements, the first diffusion region 210P in any given device may have any of the widths WL, WM, and WS, and the second diffusion region 210N in the given device may also have any of the widths WL, WM, and WS. In contrast, the second circuit 206 includes devices 212A-212C in which third diffusion region 214P and fourth diffusion region 214N each have the constant narrowest width WS. The width WS here is the same as the narrowest width WS of first and second diffusion regions 210P and 210N in the device 208C. The narrowest width WS is used for the minimum power level P1, to which the devices 208A-208C can be configured. The width WL is the widest width for the highest power level P3, and the width WM is an intermediate width for the intermediate power level P2.

As noted above, in logic circuits such as the logic circuit 200, the power level to which a majority of devices are configured is the lowest power level P1 based on current requirements. Therefore, in a logic circuit (not shown) formed entirely of circuits corresponding to the first circuit 204, a significant area would be wasted within the majority of the devices. The second circuit 206 reduces such wasted area by limiting the first and fourth diffusion regions 214P and 214N to the constant width WS and separating the first and fourth diffusion regions 214P and 214N on the substrate 202 by the minimum inner distance $I_{MIN}$. As a result, a second outside distance D2 from the first side S1 of the fourth diffusion region 214N to the second side S2 (in the Y-axis direction) of the third diffusion region 214P is less than the first outside distance D1 of the first circuit 204. The first sides S1 and the second sides S2 of the third diffusion region 214P and the fourth diffusion region 214N are orthogonal to the height direction (e.g., Y-axis direction). By reducing the outside distance D2, devices 212A-212C in the second circuit 206 may be smaller in the Y-axis direction than devices 208A-208C in the first circuit 204. Thus, the second circuit 206 occupies less area of the substrate 202 than the first circuit 204, and employing a combination of the first circuit 204 and the second circuit 206 in the logic circuit 200 provides the larger power levels (e.g., P2 and P3) where needed while occupying a smaller area of the substrate 202 compared to having only the first circuit 204. For example, the first circuit 204 having longitudinal axes X1 and X2 in the X-axis direction, and the second circuit 206, having longitudinal axes X3 and X4 in the X-axis direction, may be repeated alternately in the Y-axis direction (e.g., where every other circuit is a first circuit 204, and the others are circuits 206). Alternatively, if fewer high-power level devices are needed, the logic circuit 200 may include two of the second circuits 206 for each of the first circuits 204, to save more area.

The logic circuit 200 is described as shown in FIG. 2, in which the first circuit 204 is disposed below (in the Y-axis direction) the second circuit 206, and features of the logic circuit 200 may also be referred to herein as lower and upper, respectively, but such terms are not intended to limit a positional relationship of the disclosed features. In this regard, the first circuit 204 includes a first diffusion region 210P disposed above the substrate 202 and having the axis X1 disposed in the X-axis direction, and a second diffusion region 210N disposed above the substrate 202 and having the longitudinal axis X2 disposed in the X-axis direction. The first and second diffusion regions 210P and 210N and the first and fourth diffusion regions 214P and 214N are employed as channel regions of transistors, such as the GAA transistor 112 in FIG. 1B. Accordingly, the diffusion regions 210P. 210N, 214P, and 214N are formed of a semiconductor material, such as silicon (Si), that is doped with either a pentavalent dopant or a trivalent dopant, and the type of dopant determines whether a diffusion region is a P-type or an N-type diffusion region. In particular, a semiconductor doped with a trivalent dopant may be referred to as a P-type diffusion region, and a semiconductor doped with a pentavalent dopant may be referred to as an N-type diffusion region. The term "first-type diffusion region" may refer to either the P-type or the N-type, and the term "second-type diffusion region" refers to one of the P-type and N-type that is opposite to the first-type diffusion region.

In some examples, the third diffusion region 214P comprises a first-type diffusion region (e.g., P-type or N-type), and the fourth diffusion region 214N comprises a second-type diffusion region (N-type or P-type). In such examples, the first diffusion region 210P comprises the first-type diffusion region (e.g., P-type or N-type), and the second diffusion region 210N comprises the second-type diffusion region (N-type or P-type).

The first circuit 204 also includes a plurality of first gates 220(1)-220(5) having longitudinal axes Y1-Y5 and disposed in the Y-axis direction substantially orthogonal to the X-axis direction. The first circuit 204 includes the plurality of first devices 208A-208C, each including a first portion $222A_P$-$222C_P$ of the first diffusion region 210P and a second portion $222A_N$-$222C_N$ of the second diffusion region 210N. Although each of the second portions $222A_N$-$222C_N$ have a same width (e.g., WS, WM, or WL) as a corresponding one of the first portions $222A_P$-$222C_P$ in FIG. 2, this is merely one non-limiting example. As indicated above, the second portions $222A_N$-$222C_N$ may have different widths than the corresponding one of the first portions $222A_P$-$222C_P$. Each of the plurality of first devices 208A-208C also includes one of the plurality of first gates 220(1)-220(5) disposed above the corresponding first portion (e.g., $222A_P$) and above the corresponding second portion (e.g., $222A_N$).

The second circuit 206 is disposed adjacent to (e.g., next to and substantially parallel to), in the Y-axis direction, the first circuit 204. Specifically, this example has no diffusion regions between the first diffusion region 210P and the third diffusion region 214P. The second circuit 206 includes a third diffusion region 214P disposed above the substrate 202 and having the axis X3 disposed in the X-axis direction, and a fourth diffusion region 214N disposed above the substrate 202 and having the longitudinal axis X4 disposed in the X-axis direction. The third diffusion region 214P, and the fourth diffusion region 214N are previously referred to as the diffusion regions 214N and 214P. The second circuit 206 also includes a plurality of second gates 224(1)-224(5), which extend along the longitudinal axes Y1-Y5. Thus, the plurality of second gates 224(1)-224(5) are disposed in the Y-axis direction substantially orthogonal to the X-axis direction and may be aligned with the plurality of first gates 220(1)-220(5). The second circuit 206 includes a plurality of second devices 212A-212C that each includes a third portion $226A_P$-$226C_P$ of the third diffusion region 214P and a fourth portion $226A_N$-$226C_N$ of the fourth diffusion region 214N. Each of the plurality of second devices 212A-212C also includes one of the plurality of second gates 224(1)-224(5) disposed above the corresponding first portion (e.g., $226A_P$) and above the corresponding second portion (e.g., $226A_N$).

In the logic circuit 200, each of the third diffusion region 214P, the fourth diffusion region 214N, the first diffusion region 210P, and the second diffusion region 210N comprises a first side S1 in the X-axis direction and a second side S2 in the X-axis direction, both of which are orthogonal to the height direction (Y-axis direction). The fourth diffusion region 214N is disposed on the first side S1 of the third diffusion region 214P, the second diffusion region 210N is disposed on the second side S2 of the first diffusion region 210P, and the second outside distance D2 from the first side S1 of the fourth diffusion region 214N to the second side S2 of the third diffusion region 214P is less than the first outside distance D1 from the first side S1 of the first diffusion region 210P to the second side S2 of the second diffusion region 210N.

The third diffusion region 214P has the width WS between the first side S1 and the second side S2 in the Y-axis direction, and the fourth diffusion region 214N also has the width WS between the first side S1 and the second side S2 in the Y-axis direction. On the other hand, the first diffusion region 210P and the second diffusion region 210N each have the width WL, which is greater than the width WS, between the first side S1 and the second side S2 in the Y-axis direction.

The first outside distance D1 in a first one 208A of the plurality of devices 208A-208C in the first circuit 204 is the same as the first outside distance D1 in a second one 208C of the plurality of devices 208A-208C. However, an inner distance I1A from the first side S1 of the second diffusion region 210N to the second side S2 of the first diffusion region 210P in the first one 208A of the plurality of first devices 208A-208C is different from a second inner distance I1C from the first side S1 of the second diffusion region 210N to the second side S2 of the first diffusion region 210P in the third one 208C of the plurality of first devices 208A-208C. In this example, inner distance I1A is the minimum inner distance $I_{MIN}$.

In the second circuit 206 in FIG. 2, the third diffusion region 214P has the width WS in each of the plurality of second devices 212A-212C, and the fourth diffusion region 214N also has the width WS in each of the plurality of second devices 212A-212C. Thus, the diffusion regions 214P and 214N have a constant width WS.

In some examples of the first circuit 204, the first diffusion region 210P and the second diffusion region 210N may each have the width WL (e.g., the largest width corresponding to the highest power level P3) in every one of the plurality of devices 208A-208C. Alternatively, in other examples, the first diffusion region 210P and the second diffusion region 210N may each have the width WM (e.g., the intermediate width corresponding to the intermediate power level P2) in every one of the plurality of devices 208A-208C.

In some examples of the first circuit 204, the first diffusion region 210P and the second diffusion region 210N in the plurality of devices 208A-208C may have the width WM in one or more of the plurality of devices 208A-208C and the width WL (e.g., the largest width corresponding the highest power level P3) in the remaining ones of the plurality of devices 208A-208C. Alternatively, the first diffusion region 210P and the second diffusion region 210N in the plurality of devices 208A-208C may have the width WM in one or more of the plurality of devices 208A-208C and the width WS (e.g., the narrowest width corresponding to the lowest power level P1) in the remaining ones of the plurality of devices 208A-208C.

In some examples, the first diffusion region 210P and the second diffusion region 210N may have the widest width WL in a first one of the plurality of devices 208A-208C, the intermediate width WM in a second one of the plurality of devices 208A-208C, and the narrowest width WS in a third one of the plurality of devices 208A-208C.

It should be understood that each of the first circuit 204 and the second circuit 206 are not limited to the devices 208A-208C and may have any number of devices, as needed, comprising the widths disclosed herein. In addition, the first diffusion regions 210P, 214P, and second diffusion regions 210N, 214N are not limited to the configuration shown. For example, the first diffusion regions 210P. 214P may switch positions with their corresponding second diffusion regions 210N, 214N. Alternatively, the first circuit 204 may be on the first side S1 of the second circuit 206.

It should also be understood that cross-sectional views of the diffusion regions 210P, 210N, and 214P, 214N (not shown) may correspond to the cross-sectional view in FIG. 1B. In such examples, each of the third diffusion region 214P, the fourth diffusion region 214N, the first diffusion region 210P, and the second diffusion region 210N may comprise a vertical stack of at least one nanosheet (e.g., corresponding to the nanosheets 114(1)-114(3) as shown in FIG. 1B) and the devices 208A-208C and 212A-212C may be gate-all-around (GAA) transistors. The plurality of first gates 220(1)-220(5) are disposed adjacent to all sides of each of the nanosheets in the first diffusion region 210P and the second diffusion region 210N, and the plurality of second gates 224(1)-224(5) are disposed on all sides of the third diffusion region 214P and the fourth diffusion region 214N, which include at least the sides S1 and S2 as well as top surfaces S3 and bottom surfaces S4, as shown in FIG. 1B.

As shown in FIG. 2, the gates 220(1), 220(3), and 220(5) are disposed on the portions $222A_P$-$222C_P$ and the portions $222A_N$-$222C_N$ in the devices 208A, 208B, and 208C, respectively. The gates 224(1), 224(3), and 224(5) are disposed on portions $226A_P$-$226C_P$ and the portions $226A_N$-$226C_N$ in the devices 212A, 212B, and 212C, respectively. The gate 224(2) may be a non-functional (e.g., "dummy") gate between the devices 212A and 212B, and the gate 224(4) may be a dummy gate between the devices 212B and 212C.

Figure 3A:
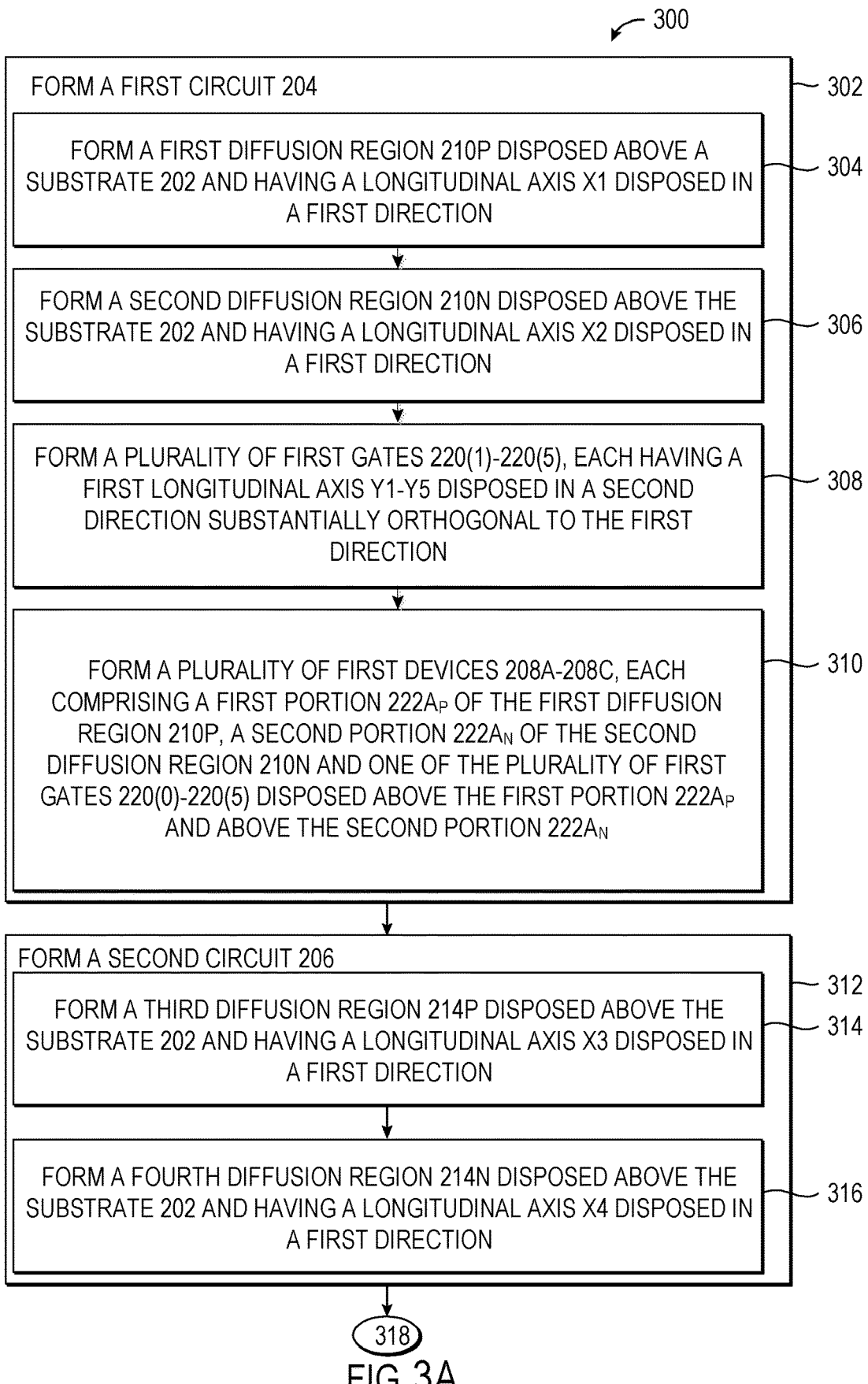

FIG. 3 is a flow chart illustrating a method 300 of fabricating a logic circuit corresponding to the logic circuit 200 in FIG. 2. The method includes forming a first circuit 204 (block 302), which includes forming a first diffusion region 210P disposed above a substrate 202 and having a longitudinal axis X1 disposed in a first direction (block 304), and forming a second diffusion region 210N disposed above the substrate 202 and having a longitudinal axis X2 disposed in the first direction (block 306). Forming the first circuit 204 further includes forming a plurality of first gates 220(1)-220(5), each having a longitudinal axis Y1-Y5 and disposed in a second direction substantially orthogonal to the first direction (block 308) and forming a plurality of first devices 208A-208C, each comprising a first portion $222A_P$ of the first diffusion region 210P, a second portion $222A_N$ of the second diffusion region 210N, and one of the plurality of first gates 220(1)-220(5) disposed above the first portion $222A_P$ and above the second portion $222A_N$ (block 310).

The method further comprises forming a second circuit 206 disposed adjacent to, in the second direction, the first circuit 204 (block 312), which includes forming a third diffusion region 214P disposed above the substrate 202 and having a longitudinal axis X3 disposed in a first direction (block 314), and forming a fourth diffusion region 214N disposed above the substrate 202 and having a longitudinal axis X4 disposed in the first direction (block 316). Forming the second circuit 206 further includes forming a plurality of second gates 224(1)-224(5), each having a longitudinal axis Y1-Y5 and disposed in a second direction substantially orthogonal to the first direction (block 318) and forming a plurality of second devices 212A-212C, each comprising a first portion $226A_P$ of the third diffusion region 214P, a second portion $226A_N$ of the fourth diffusion region 214N, and one of the plurality of second gates 224(1)-224(5) disposed above the first portion $226A_P$ and above the second portion $226A_N$ (block 320). In the logic circuit 200 formed according to the method 300, each of the third diffusion region 214P, the fourth diffusion region 214N, the first diffusion region 210P, and the second diffusion region 210N comprises a first side S1 and a second side S2 in the second direction, and the fourth diffusion region 214N is disposed on the first side S1 of the third diffusion region 214P and the second diffusion region 210N is disposed on the second side S2 of the first diffusion region 210P. A second distance D2 from the first side S1 of the fourth diffusion region 214N to the second side S2 of the third diffusion region 214P is less than a first distance D1 from the first side S1 of the first diffusion region 210P to the second side S2 of the second diffusion region 210N.

Figure 4:
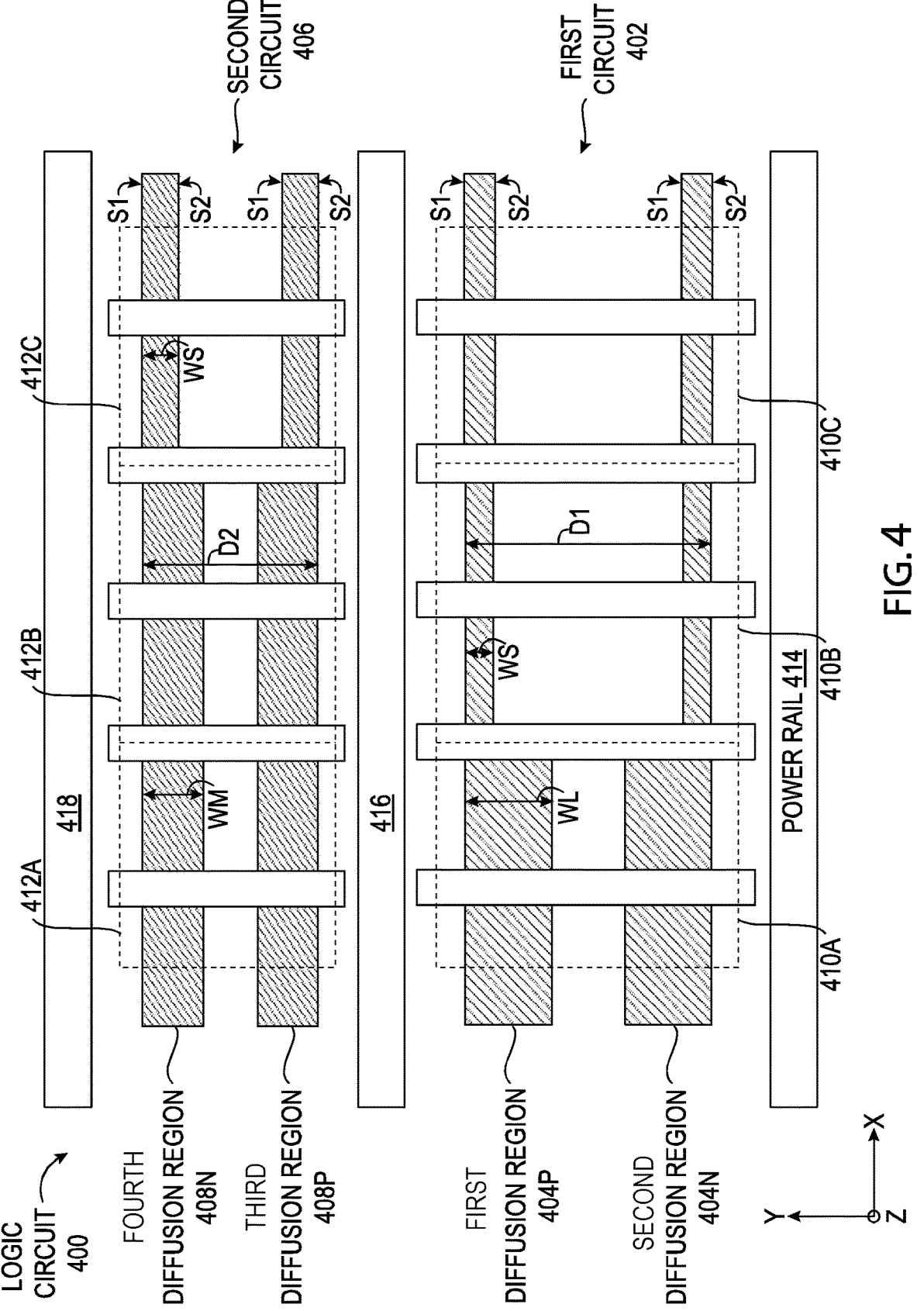
FIG. 4 is a top plan view of another example of a logic circuit, including a first circuit, as shown in FIG. 1A, and a second circuit having a diffusion region outside distance based on an intermediate diffusion region width corresponding to an intermediate power level.

FIG. 4 is an illustration of another example of a logic circuit 400, including a first circuit 402 in which an outside distance D1 of devices 410A-410C, measured from a first side S1 of a second diffusion region 404P to a second side S2 of a first diffusion region 404N, is greater than an outside distance D2 in a second circuit 406 in devices 412A-412C from a first side S1 of a fourth diffusion region 408N to a second side S2 of a third diffusion region 404P. In this example, the second diffusion region 404P and the first diffusion region 404N in the first circuit 402 are configurable in width to one of a plurality of widths including a widest width WL, an intermediate width WM, and a narrowest width WS depending on power requirements in each of a plurality of devices 410A-410C. The third diffusion region 408P and the fourth diffusion region 408N in the second circuit 406 each have the intermediate width WM in at least a first one of a plurality of devices 412A-412C and have the narrowest width WS in remaining ones (e.g., 212C) of the plurality of second devices 212A-212C. In this example, standard cells in the second circuit 406 may be limited to the lower two power levels P2 and P1, corresponding to the intermediate width WM and the narrowest width WS of the diffusion regions 408P and 408N. Since the upper first and second diffusion regions 408P and 408N are not configurable to the widest width WL, the outside distance D2 can be set to accommodate the intermediate width WM but not the widest width WL. Therefore, in this example, the outside distance D2 in the second circuit 406 is less than the outside distance D1 in the first circuit 402. The logic circuit 400 in FIG. 4 would reduce area compared to logic circuits using only the circuit 100 in FIG. 1 but would not save as much area as the logic circuit 200 in FIG. 2, which also employs the second circuit 206.

Additional features shown in FIG. 4 are power rails 414, 416, and 418. In the example in FIG. 4, the plurality of first devices 410A-410C are coupled between the power rail 414 and the power rail 416, and the plurality of second devices 412A-412C are coupled between the power rails 416 and 418. In such an example, one of a power supply voltage $V_{DD}$ or ground voltage $V_{SS}$ is provided to the power rail 414 and would also be provided to the power rail 418, while the other one of the ground $V_{SS}$ and power supply voltage $V_{DD}$ would be provided to the power rail 416. For example, in an example in which the second diffusion region 404P and the third diffusion region 408P are P-type diffusion regions, the power supply voltage $V_{DD}$ may be provided to the power rail 416, and the ground voltage $V_{SS}$ (e.g., 0 volts) may be provided to the power rails 414 and 418. Although not shown, the logic circuit 200 in FIG. 2 also includes power rails corresponding to the power rails 414, 416, and 418, but they are not included in FIG. 2 to reduce drawing congestion.

Figure 5:
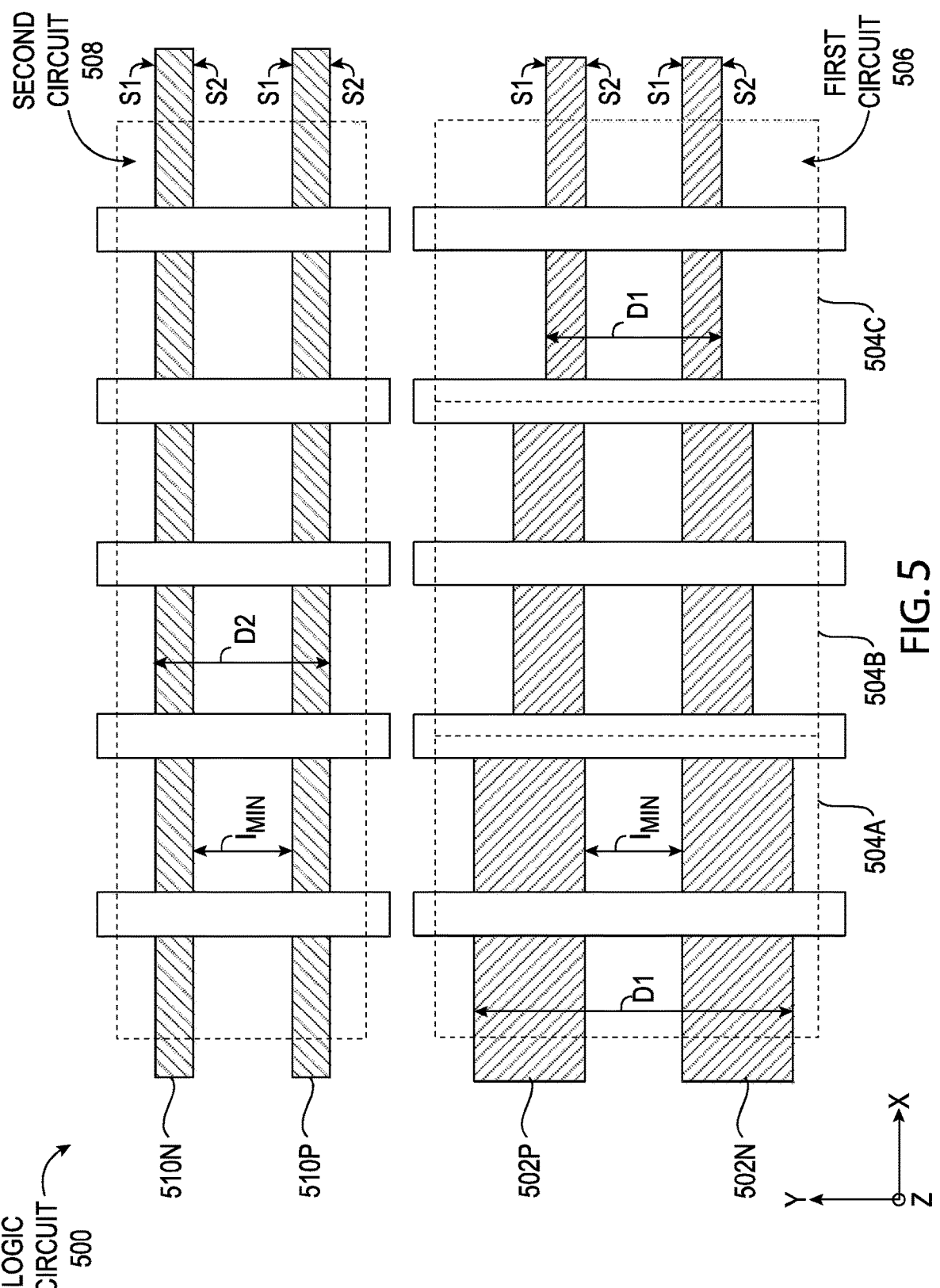
FIG. 5 is a top plan view of another example of a logic circuit including a first circuit including diffusion regions on a substrate and configured, in each device, for one of a plurality of power levels but each having a same diffusion region inner distance and a second circuit as shown in FIG. 2.

FIG. 5 is an illustration of a logic circuit 500 in which an inner distance $I_{MIN}$ from the first side S1 of a second diffusion region 502N to the second side S2 of a first diffusion region 502P is the same in all of a plurality of first devices 504A-504C in a first circuit 506. However, in this example, the outside distance D1 from the first side S1 of the first diffusion region 502P to the second side S2 of the second diffusion region 502N in the device 504A is different from the outside distance D1 in another one of the plurality of device 504A-504C. In other words, in some examples, the standard cells in the first circuit 506 may have a constant inner distance $I_{MIN}$ between the lower first and second diffusion regions 502P and 502N, but the outside distance D1 varies because the lower first and second diffusion regions 502P and 502N are configurable to any of the widths WL, WM, and WS described above, corresponding to any of the power levels P1-P3. A second circuit 508, in FIG. 5, corresponds to the second circuit 206 in FIG. 2, having a constant inner distance $I_{MIN}$ and an outside distance D2 based on upper first and second diffusion regions 510P and 510N having the narrowest width WS in the Y-axis direction corresponding to the lowest power level P1.

The logic circuits, which have different heights according to aspects disclosed herein, may be provided in or integrated into any processor-based device. Examples, without limitation, include a set-top box, an entertainment unit, a navigation device, a communications device, a fixed location data unit, a mobile location data unit, a global positioning system (GPS) device, a mobile phone, a cellular phone, a smartphone, a session initiation protocol (SIP) phone, a tablet, a phablet, a server, a computer, a portable computer, a mobile computing device, a wearable computing device (e.g., a smartwatch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 6:
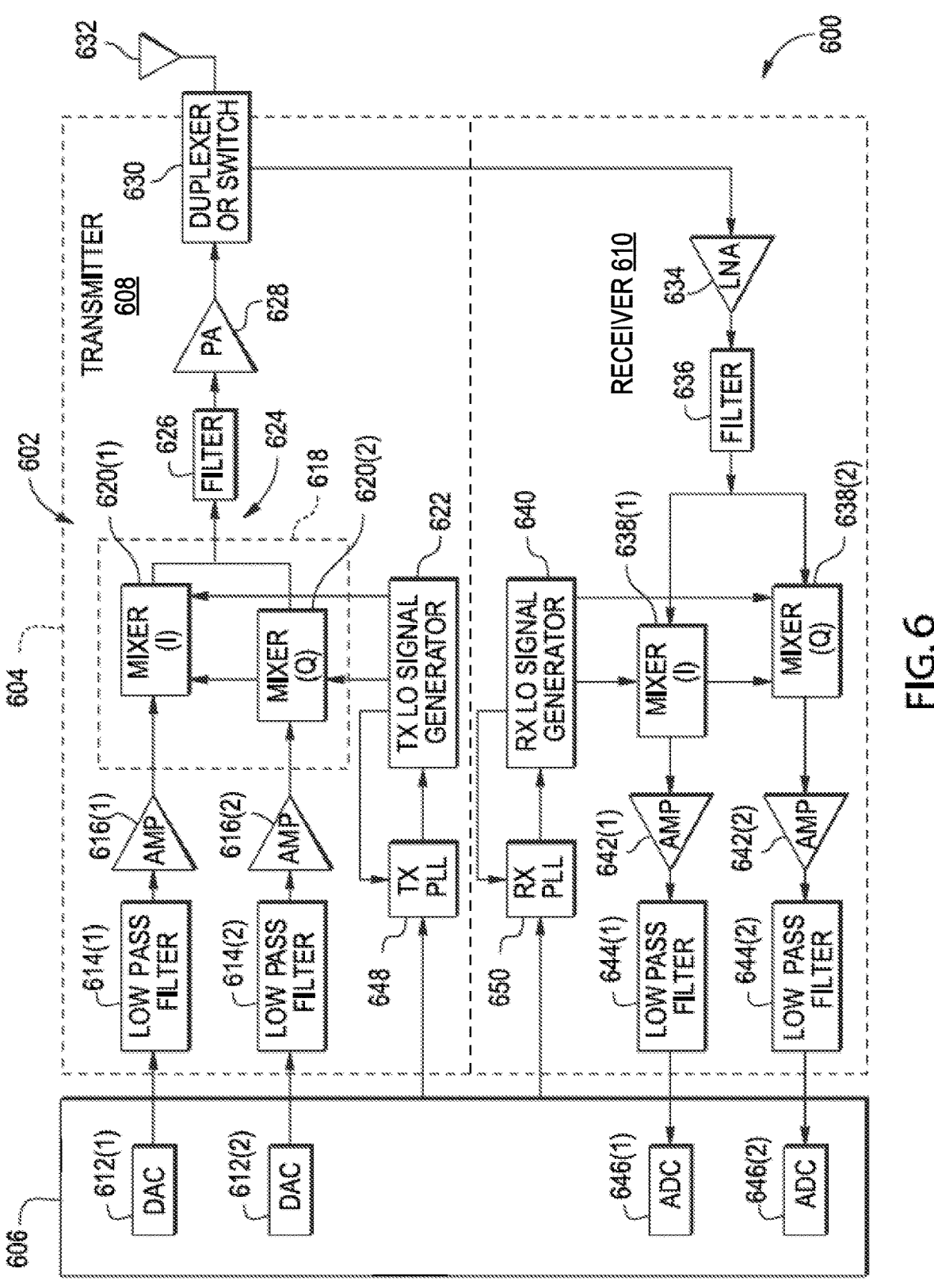
FIG. 6 is a block diagram of an exemplary wireless communications device, including integrated circuits (ICs) that can include logic circuits as shown in any of FIGS. 2, 4, and 5.

In this regard, FIG. 6 illustrates an exemplary wireless communications device 600 that includes radio frequency (RF) components formed from one or more ICs 602, wherein any of the ICs 602 can include logic circuits with a circuit of configurable devices having a first outside distance and a second circuit of lower power devices having a second, smaller dimension for reduced area consumption, as illustrated in FIGS. 2, 4, and 5, and according to any aspects disclosed herein. The wireless communications device 600 may include or be provided in any of the above-referenced devices as examples. As shown in FIG. 6, the wireless communications device 600 includes a transceiver 604 and a data processor 606. The data processor 606 may include a memory to store data and program codes. The transceiver 604 includes a transmitter 608 and a receiver 610, which support bi-directional communications. In general, the wireless communications device 600 may include any number of transmitters 608 and/or receivers 610 for any number of communication systems and frequency bands. All or a portion of the transceiver 604 may be implemented on one or more analog ICs, RF ICs (RFICs), mixed-signal ICs, etc.

The transmitter 608 or receiver 610 may be implemented with a super-heterodyne or direct-conversion architecture. In the super-heterodyne architecture, a signal is frequency-converted between RF and baseband in multiple stages, e.g., from RF to an intermediate frequency (IF) in one stage and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 600 in FIG. 6, the transmitter 608 and the receiver 610 are implemented with the direct-conversion architecture.

In the transmit path, the data processor 606 processes data to be transmitted and provides I and Q analog output signals to the transmitter 608. In the exemplary wireless communications device 600, the data processor 606 includes digital-to-analog converters (DACs) 612(1), 612(2) for converting digital signals generated by the data processor 606 into I and Q analog output signals, e.g., I and Q output currents, for further processing.

Within the transmitter 608, lowpass filters 614(1), 614(2) filter the I and Q analog output signals, respectively, to remove undesired signals caused by the prior digital-to-analog conversion. Amplifiers (AMPs) 616(1), 616(2) amplify the signals from the lowpass filters 614(1), 614(2), respectively, and provide I and Q baseband signals. An upconverter 618 upconverts the I and Q baseband signals with I and Q transmit (TX) local oscillator (LO) signals from a TX LO signal generator 622 through mixers 620(1), 620(2) to provide an upconverted signal 624. A filter 626 filters the upconverted signal 624 to remove undesired signals caused by the frequency upconversion as well as noise in a receive frequency band. A power amplifier (PA) 628 amplifies the upconverted signal 624 from the filter 626 to obtain the desired output power level and provides a transmit RF signal. The transmit RF signal is routed through a duplexer or switch 630 and transmitted via an antenna 632.

In the receive path, the antenna 632 receives signals transmitted by base stations and provides a received RF signal, which is routed through the duplexer or switch 630 and provided to a low noise amplifier (LNA) 634. The duplexer or switch 630 is designed to operate with a specific receive (RX)-to-TX duplexer frequency separation, such that RX signals are isolated from TX signals. The received RF signal is amplified by the LNA 634 and filtered by a filter 636 to obtain a desired RF input signal. Downconversion mixers 638(1), 638(2) mix the output of the filter 636 with I and Q RX LO signals (i.e., LO_I and LO_Q) from an RX LO signal generator 640 to generate I and Q baseband signals. The I and Q baseband signals are amplified by AMPs 642(1), 642(2) and further filtered by lowpass filters 644(1), 644(2) to obtain I and Q analog input signals, which are provided to the data processor 606. In this example, the data processor 606 includes analog-to-digital converters (ADCs) 646(1), 646(2) for converting the analog input signals into digital signals to be further processed by the data processor 606.

In the wireless communications device 600 of FIG. 6, the TX LO signal generator 622 generates the I and Q TX LO signals used for frequency upconversion, while the RX LO signal generator 640 generates the I and Q RX LO signals used for frequency downconversion. Each LO signal is a periodic signal with a particular fundamental frequency. A TX phase-locked loop (PLL) circuit 648 receives timing information from the data processor 606 and generates a control signal used to adjust the frequency and/or phase of the TX LO signals from the TX LO signal generator 622. Similarly, an RX PLL circuit 650 receives timing information from the data processor 606 and generates a control signal used to adjust the frequency and/or phase of the RX LO signals from the RX LO signal generator 640.

Figure 7:
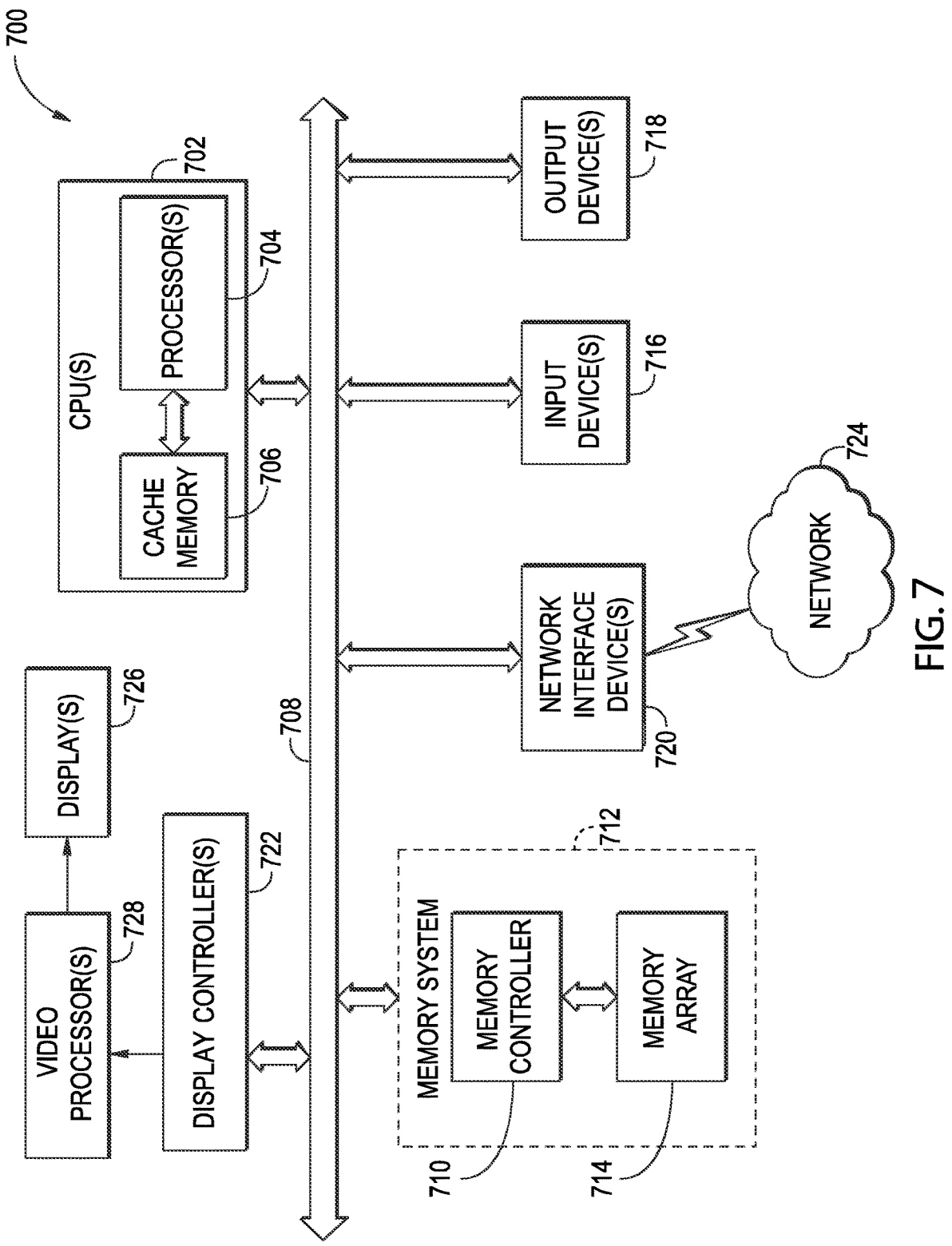
FIG. 7 is a block diagram of an exemplary processor-based system that can include the logic circuits of FIGS. 2, 4, and 5.

FIG. 7 illustrates an example of a processor-based system 700 that can employ logic circuits with a circuit of configurable devices having a first outside distance and a second circuit of lower power devices having a second, smaller dimension for reduced area consumption, as illustrated in FIGS. 2, 4, and 5. In this example, the processor-based system 700 includes one or more central processor units (CPUs) 702, which may also be referred to as CPU or processor cores, each including one or more processors 704. The CPU(s) 702 may have cache memory 706 coupled to the processor(s) 704 for rapid access to temporarily stored data. The CPU(s) 702 is coupled to a system bus 708 and can intercouple master and slave devices included in the processor-based system 700. As is well known, the CPU(s) 702 communicates with these other devices by exchanging address, control, and data information over the system bus 708. For example, the CPU(s) 702 can communicate bus transaction requests to a memory controller 710 as an example of a slave device. Although not illustrated in FIG. 7, multiple system buses 708 could be provided; wherein each system bus 708 constitutes a different fabric.

Other master and slave devices can be connected to the system bus 708. As illustrated in FIG. 7, these devices can include a memory system 712 that includes the memory controller 710 and one or more memory arrays 714, one or more input device(s) 716, one or more output device(s) 718, one or more network interface device(s) 720, and one or more display controller(s) 722, as examples. The input device(s) 716 can include any type of input device, including, but not limited to, input keys, switches, voice processors, etc. The output device(s) 718 can include any type of output device, including, but not limited to, audio, video, other visual indicators, etc. The network interface device(s) 720 can be any device configured to allow an exchange of data to and from a network 724. The network 724 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 720 can be configured to support any type of communications protocol desired.

The CPU(s) 702 may also be configured to access the display controller(s) 722 over the system bus 708 to control information sent to one or more display(s) 726. The display controller(s) 722 sends information to the display(s) 726 to be displayed via one or more video processors 728, which process the information to be displayed into a format suitable for the display(s) 726. The display(s) 726 can include any type of display, including, but not limited to, a cathode ray tube (CRT), a liquid crystal display (LCD), a plasma display, or a light-emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium wherein any such instructions are executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications, as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

Implementation examples are described in the following numbered clauses:

1. A logic circuit, comprising:

a first circuit, comprising:

a first diffusion region disposed above a substrate and having a longitudinal axis disposed in a first direction;

a second diffusion region disposed above the substrate and having a longitudinal axis disposed in the first direction;

a plurality of first gates, each having a first longitudinal axis disposed in a second direction substantially orthogonal to the first direction; and a plurality of first devices, each comprising:

a first portion of the first diffusion region;

a second portion of the second diffusion region; and one of the plurality of first gates disposed above the first portion and above the second portion; and a second circuit, disposed adjacent to, in the second direction, the first circuit, the second circuit comprising:

a third diffusion region disposed above the substrate and having a longitudinal axis disposed in the first direction;

a fourth diffusion region disposed above the substrate and having a longitudinal axis disposed in the first direction;

a plurality of second gates, each having a second longitudinal axis disposed in the second direction; and a plurality of second devices, each comprising:

a third portion of the third diffusion region;

a fourth portion of the fourth diffusion region; and one of the plurality of second gates disposed above the third portion and above the fourth portion;

wherein:

each of the third diffusion region, the fourth diffusion region, the first diffusion region, and the second diffusion region comprises a first side and a second side orthogonal to the second direction;

the fourth diffusion region is disposed on the first side of the third diffusion region;

the first diffusion region is disposed on the first side of the second diffusion region; and a second distance from the first side of the fourth diffusion region to the second side of the third diffusion region is less than a first distance from the first side of the first diffusion region to the second side of the second diffusion region.

2. The logic circuit of clause 1, wherein the first distance and the second distance are along a same axis.

3. The logic circuit of clause 1 or clause 2, wherein:
   the third diffusion region comprises a first type diffusion region;
   the fourth diffusion region comprises a second type diffusion region different from the first type diffusion region;
   the first diffusion region comprises the first type diffusion region; and
   the second diffusion region comprises the second type diffusion region.
4. The logic circuit of clause 1 or clause 2, wherein:
   the third diffusion region comprises a first type diffusion region;
   the fourth diffusion region comprises a second type diffusion region different from the first type diffusion region;
   the first diffusion region comprises the second type diffusion region; and
   the second diffusion region comprises the first type diffusion region.
5. The logic circuit of any of clause 1 to clause 4, wherein:
   the third diffusion region has a first width between the first side and the second side;
   the fourth diffusion region has the first width between the first side and the second side;
   the first diffusion region has a second width greater than the first width between the first side and the second side; and
   the second diffusion region has the second width between the first side and the second side.
6. The logic circuit of clause 5, wherein:
   the third diffusion region and the fourth diffusion region have the first width along a first axis;
   the first diffusion region and the second diffusion region have the second width along the first axis.
7. The logic circuit of any of clause 1 to clause 6, wherein:
   a first outside distance from the first side of the first diffusion region to the second side of the second diffusion region in a first one of the plurality of first devices is the same as a second outside distance from the first side of the first diffusion region to the second side of the second diffusion region in a second one of the plurality of first devices; and
   a first inner distance from the first side of the second diffusion region to the second side of the first diffusion region in the first one of the plurality of first devices is different from a second inner distance from the first side of the second diffusion region to the second side of the first diffusion region in the second one of the plurality of first devices.
8. The logic circuit of clause 5 or clause 6, wherein:
   the third diffusion region has the first width in each of the plurality of second devices; and
   the fourth diffusion region has the first width in each of the plurality of second devices.
9. The logic circuit of clause 5, clause 6, or clause 8, wherein:
   the second circuit has a first inner distance between the first side of the third diffusion region and the second side of the fourth diffusion region in each of the plurality of second devices.
10. The logic circuit of clause 5, clause 6, clause 8, or clause 9, wherein:
   the second circuit has a first outside distance between the second side of the third diffusion region and the first side of the fourth diffusion region in each of the plurality of second devices.

11. The logic circuit of any of clause 5, clause 6, and clause 8 to clause 10, wherein:
   the first diffusion region and the second diffusion region each have the second width in a first one of the plurality of first devices and a third width, greater than the second width, in a second one of the plurality of first devices.
12. The logic circuit of any of clause 5, clause 6, and clause 8 to clause 10, wherein:
   the first diffusion region and the second diffusion region each have the second width in a first one of the plurality of first devices and have the first width in a second one of the plurality of first devices.
13. The logic circuit of clause 11, wherein:
   the first diffusion region and the second diffusion region each have the first width in a third one of the plurality of first devices.
14. The logic circuit of any of clause 1 to clause 13, wherein:
   each of the third diffusion region, the fourth diffusion region, the first diffusion region, and the second diffusion region comprises at least one nanosheet; and
   the plurality of first devices and the plurality of second devices comprise gate-all-around transistors.
15. The logic circuit of any of clause 1 to clause 6 and clause 8 to clause 14, wherein:
   a first inner distance from the first side of the second diffusion region to the second side of the first diffusion region in a first one of the plurality of first devices is the same as a second inner distance from the first side of the second diffusion region to the second side of the first diffusion region in a second one of the plurality of first devices; and
   a first outside distance in the first one of the plurality of first devices is different from a second outside distance in the second one of the plurality of first devices.
16. The logic circuit of clause 13, wherein the plurality of first gates comprises:
   a first dummy gate disposed between the first one of the plurality of first devices and the second one of the plurality of first devices; and
   a second dummy gate disposed between the first one of the plurality of first devices and the third one of the plurality of first devices.
17. The logic circuit of any of clause 1 to clause 16 integrated into an integrated circuit (IC).
18. The logic circuit of any of clause 1 to clause 17, integrated into a device selected from the group consisting of: a set-top box; an entertainment unit; a navigation device; a communications device; a fixed location data unit; a mobile location data unit; a global positioning system (GPS) device; a mobile phone; a cellular phone; smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

19. A semiconductor die, comprising:

a first power rail and a second power rail, each having a longitudinal axis disposed in a first direction and configured to provide a first one of a power supply voltage and a reference voltage;

a third power rail having a longitudinal axis disposed in the first direction and configured to provide a second one of the power supply voltage and the reference voltage; and a logic circuit comprising:

a first circuit, comprising:

a first diffusion region disposed above a substrate and having a longitudinal axis disposed in the first direction;

a second diffusion region disposed above the substrate and having a longitudinal axis disposed in the first direction;

a plurality of first gates, each having a longitudinal axis disposed in a second direction substantially orthogonal to the first direction; and a plurality of first devices, each comprising:

a first portion of the first diffusion region;

a second portion of the second diffusion region; and one of the plurality of first gates disposed above the first portion and above the second portion; and a second circuit, disposed adjacent to, in the second direction, the first circuit, the second circuit comprising:

a third diffusion region disposed above the substrate and having a longitudinal axis disposed in the first direction;

a fourth diffusion region disposed above the substrate and having a longitudinal axis disposed in the first direction;

a plurality of second gates, each having a longitudinal axis disposed in the second direction; and a plurality of second devices, each comprising:

a third portion of the third diffusion region;

a fourth portion of the fourth diffusion region; and one of the plurality of second gates disposed above the third portion and above the fourth portion;

wherein:

the first circuit is coupled to each of the first power rail and the third power rail;

the second circuit is coupled to each of the second power rail and the third power rail;

each of the third diffusion region, the fourth diffusion region, the first diffusion region, and the second diffusion region comprises a first side and a second side orthogonal to the second direction;

the fourth diffusion region is disposed on the first side of the third diffusion region;

the first diffusion region is disposed on the first side of the second diffusion region; and a second distance from the first side of the fourth diffusion region to the second side of the third diffusion region is less than a first distance from the first side of the first diffusion region to the second side of the second diffusion region.

20. A method of fabricating a logic circuit, the method comprising:

forming a first circuit, comprising:

a first diffusion region disposed above a substrate and having a longitudinal axis disposed in a first direction;

a second diffusion region disposed above the substrate and having a longitudinal axis disposed in the first direction;

a plurality of first gates, each having a first longitudinal axis disposed in a second direction substantially orthogonal to the first direction; and a plurality of first devices, each comprising:

a first portion of the first diffusion region;

a second portion of the second diffusion region; and one of the plurality of first gates disposed above the first portion and above the second portion; and forming a second circuit, disposed adjacent to, in the second direction, the first circuit, the second circuit comprising:

a third diffusion region disposed above the substrate and having a longitudinal axis disposed in the first direction;

a fourth diffusion region disposed above the substrate and having a longitudinal axis disposed in the first direction;

a plurality of second gates, each having a second longitudinal axis disposed in the second direction; and a plurality of second devices, each comprising:

a third portion of the third diffusion region;

a fourth portion of the fourth diffusion region; and one of the plurality of second gates disposed above the third portion and above the fourth portion;

wherein:

each of the third diffusion region, the fourth diffusion region, the first diffusion region, and the second diffusion region comprises a first side and a second side orthogonal to the second direction;

the fourth diffusion region is disposed on the first side of the third diffusion region;

the first diffusion region is disposed on the first side of the second diffusion region; and a second distance from the first side of the fourth diffusion region to the second side of the third diffusion region is less than a first distance from the first side of the first diffusion region to the second side of the second diffusion region.

What is claimed is:

1. A logic circuit, comprising:

a first circuit, comprising:

a first diffusion region disposed on a substrate and having a longitudinal axis disposed in a first direction;

a second diffusion region disposed on the substrate and having a longitudinal axis disposed in the first direction;

a plurality of first gates, each having a first longitudinal axis disposed in a second direction substantially orthogonal to the first direction; and a plurality of first devices, each comprising:

a portion of the first diffusion region;

a portion of the second diffusion region; and one of the plurality of first gates disposed on the portion of the first diffusion region and on the portion of the second diffusion region; and a second circuit, disposed adjacent to, in the second direction, the first circuit, the second circuit comprising:

a third diffusion region disposed on the substrate and having a longitudinal axis disposed in the first direction;

a fourth diffusion region disposed on the substrate and having a longitudinal axis disposed in the first direction;

a plurality of second gates, each having a second longitudinal axis disposed in the second direction; and a plurality of second devices, each comprising:

a portion of the third diffusion region;

a portion of the fourth diffusion region; and one of the plurality of second gates disposed on the portion of the third diffusion region and on the portion of the fourth diffusion region;

wherein:

each of the third diffusion region, the fourth diffusion region, the first diffusion region, and the second diffusion region comprises a first side and a second side orthogonal to the second direction;

the fourth diffusion region is disposed on the first side of the third diffusion region;

the first diffusion region is disposed on the first side of the second diffusion region; and a second distance in the second direction from the first side of the fourth diffusion region to the second side of the third diffusion region is less than a first distance in the second direction from the first side of the first diffusion region to the second side of the second diffusion region.

2. The logic circuit of claim 1, wherein the first distance and the second distance are along a same axis.

3. The logic circuit of claim 1, wherein:

the third diffusion region comprises a first type diffusion region;

the fourth diffusion region comprises a second type diffusion region different from the first type diffusion region;

the first diffusion region comprises the first type diffusion region; and the second diffusion region comprises the second type diffusion region.

4. The logic circuit of claim 1, wherein:

the third diffusion region comprises a first type diffusion region;

the fourth diffusion region comprises a second type diffusion region different from the first type diffusion region;

the first diffusion region comprises the second type diffusion region; and the second diffusion region comprises the first type diffusion region.

5. The logic circuit of claim 1, wherein:

the third diffusion region has a first width between the first side and the second side;

the fourth diffusion region has the first width between the first side and the second side;

the first diffusion region has a second width greater than the first width between the first side and the second side; and the second diffusion region has the second width between the first side and the second side.

6. The logic circuit of claim 5, wherein:

the third diffusion region and the fourth diffusion region have the first width along a first axis;

the first diffusion region and the second diffusion region have the second width along the first axis.

7. The logic circuit of claim 1, wherein:

a first outside distance from the first side of the first diffusion region to the second side of the second diffusion region in a first one of the plurality of first devices is the same as a second outside distance from the first side of the first diffusion region to the second side of the second diffusion region in a second one of the plurality of first devices; and a first inner distance from the first side of the second diffusion region to the second side of the first diffusion region in the first one of the plurality of first devices is different from a second inner distance from the first side of the second diffusion region to the second side of the first diffusion region in the second one of the plurality of first devices.

8. The logic circuit of claim 5, wherein:

the third diffusion region has the first width in each of the plurality of second devices; and the fourth diffusion region has the first width in each of the plurality of second devices.

9. The logic circuit of claim 5, wherein:

the second circuit has a first inner distance between the first side of the third diffusion region and the second side of the fourth diffusion region in each of the plurality of second devices.

10. The logic circuit of claim 5, wherein:

the second circuit has a first outside distance between the second side of the third diffusion region and the first side of the fourth diffusion region in each of the plurality of second devices.

11. The logic circuit of claim 5, wherein:

the first diffusion region and the second diffusion region each have the second width in a first one of the plurality of first devices and a third width, greater than the second width, in a second one of the plurality of first devices.

12. The logic circuit of claim 5, wherein:

the first diffusion region and the second diffusion region each have the second width in a first one of the plurality of first devices and have the first width in a second one of the plurality of first devices.

13. The logic circuit of claim 11, wherein:

the first diffusion region and the second diffusion region each have the first width in a third one of the plurality of first devices.

14. The logic circuit of claim 1, wherein:

each of the third diffusion region, the fourth diffusion region, the first diffusion region, and the second diffusion region comprises at least one nanosheet; and the plurality of first devices and the plurality of second devices comprise gate-all-around transistors.

15. The logic circuit of claim 1, wherein:

a first inner distance from the first side of the second diffusion region to the second side of the first diffusion region in a first one of the plurality of first devices is the same as a second inner distance from the first side of the second diffusion region to the second side of the first diffusion region in a second one of the plurality of first devices; and a first outside distance in the first one of the plurality of first devices is different from a second outside distance in the second one of the plurality of first devices.

16. The logic circuit of claim 13, wherein the plurality of first gates comprises:

a first dummy gate disposed between the first one of the plurality of first devices and the second one of the plurality of first devices; and a second dummy gate disposed between the first one of the plurality of first devices and the third one of the plurality of first devices.

17. The logic circuit of claim 1 integrated into an integrated circuit (IC).

18. The logic circuit of claim 1, integrated into a device selected from the group consisting of: a set-top box; an entertainment unit; a navigation device; a communications device; a fixed location data unit; a mobile location data unit; a global positioning system (GPS) device; a mobile phone; a cellular phone; smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

19. A semiconductor die, comprising:

a first power rail and a second power rail, each having a longitudinal axis disposed in a first direction and configured to provide a first one of a power supply voltage and a reference voltage;

a third power rail having a longitudinal axis disposed in the first direction and configured to provide a second one of the power supply voltage and the reference voltage; and a logic circuit comprising:

a first circuit, comprising:

a first diffusion region disposed on a substrate and having a longitudinal axis disposed in the first direction;

a second diffusion region disposed on the substrate and having a longitudinal axis disposed in the first direction;

a plurality of first gates, each having a longitudinal axis disposed in a second direction substantially orthogonal to the first direction; and a plurality of first devices, each comprising:

a portion of the first diffusion region;

a portion of the second diffusion region; and one of the plurality of first gates disposed on the portion of the first diffusion region and on the portion of the second diffusion region; and a second circuit, disposed adjacent to, in the second direction, the first circuit, the second circuit comprising:

a third diffusion region disposed on the substrate and having a longitudinal axis disposed in the first direction;

a fourth diffusion region disposed on the substrate and having a longitudinal axis disposed in the first direction;

a plurality of second gates, each having a longitudinal axis disposed in the second direction; and a plurality of second devices, each comprising:

a portion of the third diffusion region;

a portion of the fourth diffusion region; and one of the plurality of second gates disposed on the portion of the third diffusion region and on the portion of the fourth diffusion region;

wherein:

the first circuit is coupled to each of the first power rail and the third power rail;

the second circuit is coupled to each of the second power rail and the third power rail;

each of the third diffusion region, the fourth diffusion region, the first diffusion region, and the second diffusion region comprises a first side and a second side orthogonal to the second direction;

the fourth diffusion region is disposed on the first side of the third diffusion region;

the first diffusion region is disposed on the first side of the second diffusion region; and a second distance in the second direction from the first side of the fourth diffusion region to the second side of the third diffusion region is less than a first distance in the second direction from the first side of the first diffusion region to the second side of the second diffusion region.

20. A method of fabricating a logic circuit, the method comprising:

forming a first circuit, comprising:

a first diffusion region disposed on a substrate and having a longitudinal axis disposed in a first direction;

a second diffusion region disposed on the substrate and having a longitudinal axis disposed in the first direction;

a plurality of first gates, each having a first longitudinal axis disposed in a second direction substantially orthogonal to the first direction; and a plurality of first devices, each comprising:

a portion of the first diffusion region;

a portion of the second diffusion region; and one of the plurality of first gates disposed on the portion of the first diffusion region and on the portion of the second diffusion region; and forming a second circuit, disposed adjacent to, in the second direction, the first circuit, the second circuit comprising:

a third diffusion region disposed on the substrate and having a longitudinal axis disposed in the first direction;

a fourth diffusion region disposed on the substrate and having a longitudinal axis disposed in the first direction;

a plurality of second gates, each having a second longitudinal axis disposed in the second direction; and a plurality of second devices, each comprising:

a portion of the third diffusion region;

a portion of the fourth diffusion region; and one of the plurality of second gates disposed on the portion of the third diffusion region and on the portion of the fourth diffusion region;

wherein:

each of the third diffusion region, the fourth diffusion region, the first diffusion region, and the second diffusion region comprises a first side and a second side orthogonal to the second direction;

the fourth diffusion region is disposed on the first side of the third diffusion region;

the first diffusion region is disposed on the first side of the second diffusion region; and a second distance in the second direction from the first
   side of the fourth diffusion region to the second side
   of the third diffusion region is less than a first
   distance in the second direction from the first side of
   the first diffusion region to the second side of the
   second diffusion region.

* * * * *